United States Patent [19]

Hauck

[11] 4,320,571
[45] Mar. 23, 1982

[54] STENCIL MASK PROCESS FOR HIGH POWER, HIGH SPEED CONTROLLED RECTIFIERS

[75] Inventor: James H. Hauck, Hermosa Beach, Calif.

[73] Assignee: International Rectifier Corporation, Los Angeles, Calif.

[21] Appl. No.: 196,684

[22] Filed: Oct. 14, 1980

[51] Int. Cl.³ ............................................. H01L 21/28
[52] U.S. Cl. ........................................ 29/591; 29/589; 29/590; 29/571; 357/68
[58] Field of Search ................. 29/589, 590, 591, 571; 357/68

[56] References Cited

U.S. PATENT DOCUMENTS

| | | | |
|---|---|---|---|
| 3,609,473 | 9/1971 | Bittmann et al. | 357/68 |
| 3,609,476 | 9/1971 | Storm | 357/68 |
| 4,096,623 | 6/1978 | Porst et al. | 29/580 |
| 4,109,372 | 8/1978 | Geffken | 29/590 X |
| 4,155,155 | 5/1979 | Bourdon et al. | 29/590 |
| 4,174,562 | 11/1979 | Sanders et al. | 29/590 X |
| 4,235,645 | 11/1980 | Johnson | 148/187 X |
| 4,278,476 | 7/1981 | Bartko et al. | 148/1.5 |

Primary Examiner—G. Ozaki
Attorney, Agent, or Firm—Ostrolenk, Faber, Gerb & Soffen

[57] ABSTRACT

Coplanar interdigitated gate and emitter contacts are accessible at the surface of a large area wafer forming a high power, high speed controlled rectifier. A pressure contact is made to the emitter contact which is raised above the level of the gate contact. The raised emitter contact is formed by a process using a novel stencil-masking technique. The process for making the raised emitter contact includes the deposition of a first aluminum layer over the full upper surface of the wafer. The aluminum is etched away from the junction between the emitter and gate layers on the upper surface of the wafer. A photoresist is then deposited over the exposed silicon between the emitter and gate metal layers and over the metallizing on the gate area. A second aluminum layer is then deposited over the full upper surface of the device including the photoresist and the exposed first layer over the emitter area and the two aluminum layers are sintered together. The photoresist prevents the sintering of the aluminum sheet overlying the base contact into the underlying metal and this portion of the novel aluminum layer lifts off, leaving a relatively shallow base or gate contact and a relatively thick emitter contact which has a surface raised above the surface of the base contact.

7 Claims, 9 Drawing Figures

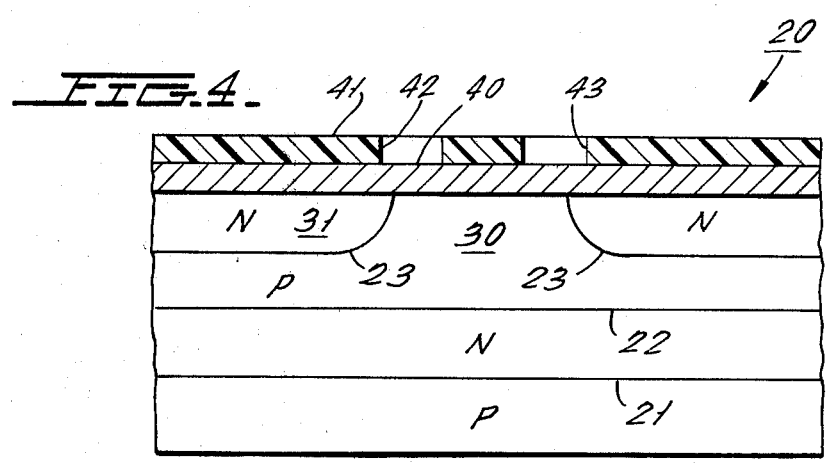
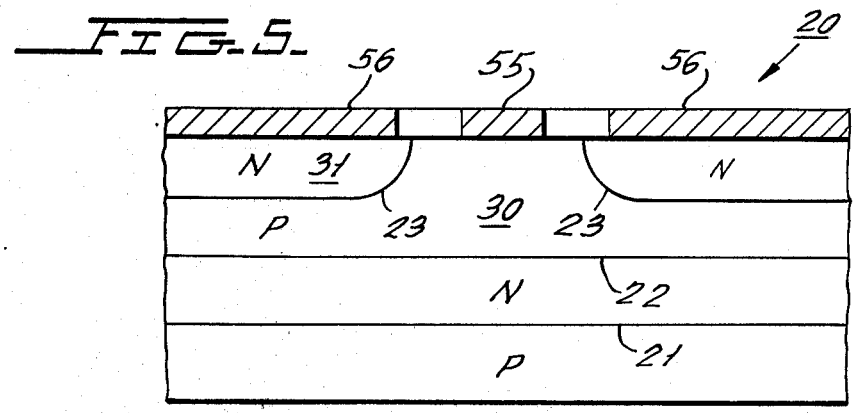
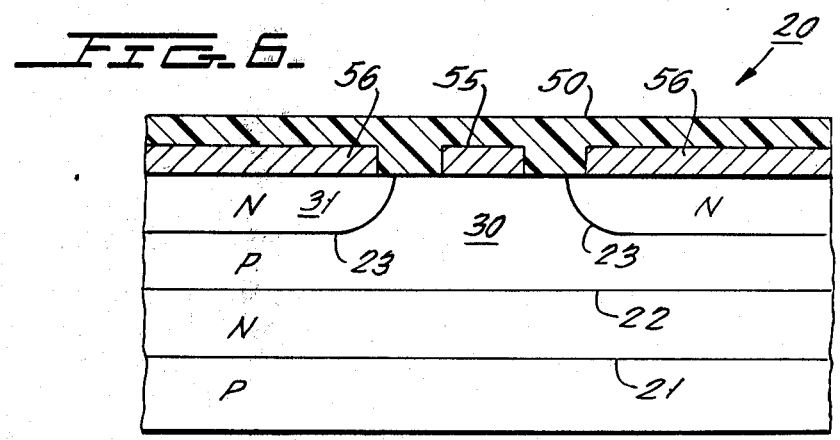

STENCIL MASK PROCESS FOR HIGH POWER, HIGH SPEED CONTROLLED RECTIFIERS

BACKGROUND OF THE INVENTION

This invention relates to high speed, high power silicon controlled rectifiers, and more specifically relates to a novel silicon controlled rectifier and process for manufacture thereof which places the flat upper emitter contact surface at a higher level than its interdigitated gate contact surface to enable a flat expansion plate contact to be laid into high pressure contact with the emitter contact without making connection to the gate contact of the device.

High speed, high power controlled rectifiers in which contact is made to the emitter contact layer by a molybdenum expansion plate or the like are well known. Such devices are shown, for example, in U.S. Pat. No. 3,609,476.

In order to make the silicon controlled rectifier or thyristor operate at as high a speed as possible, it is preferable to interdigitate the gate and emitter contacts so that the device will quickly turn on over its full area as rapidly as possible and thus be capable of operation with a high rate of rise of anode to cathode current. When the device is to have high current capacity and is made of a relatively large area wafer, it is also desired to make pressure contact to the device through an expansion plate such as a disk of molybdenum or tungsten or other material having thermal coefficient expansion characteristics similar to those of silicon. The expansion plate is pressed into high pressure contact with the emitter contact. A gate lead is then connected to the gate area which is interdigitated with the emitter.

A problem exists in making pressure contact to the emitter contact of a high current silicon controlled rectifier without also making contact to the interdigitated gate contact, thus short-circuiting the gate electrode to the emitter.

This connection has been made in the past by the use of a conductive shim having the configuration of the interdigitated emitter contact, with the shim laid atop the emitter and receiving the flat surface of an expansion contact. Because of the presence of the shim, the expansion plate does not contact the gate electrode which is interdigitated with and generally coplanar with the emitter contact. Such shims require exact orientation and one must maintain exact orientation between the shim and the emitter during assembly of the device. Moreover, it is an added part which must be handled during device assembly.

In other attempts to solve the problem, silk screening of the emitter contact material has been used to build up the emitter contact to a level higher than that of the gate contact. Arrangements such as this are shown in U.S. Pat. No. 4,155,155. A built-up emitter contact configuration which has a higher level than the gate contact which is interdigitated therewith is also shown in U.S. Pat. Nos. 3,609,476 and 4,096,623.

The processes which have been used in the silk screening approach to build up the level of the emitter contact are cumbersome and expensive and difficult to carry out in mass production.

Still another method used in the past involves the etching away of raised levels of the gate contact after the gate and emitter contacts are formed. This requires complex masking and etching processes.

BRIEF DESCRIPTION OF THE INVENTION

In accordance with the present invention, a novel method is provided for building up the emitter contact layer to a level above that of the gate contact layer which is interdigitated therewith, which method lends itself to high production rates and inexpensive processing.

In accordance with the invention, a silicon wafer is first processed in the usual manner to have interdigitated emitter and gate layers terminating on the surface of the wafer.

A thin layer of metal, preferably aluminum, is first deposited over the entire upper surface of the device. An appropriate photolithographic mask is then applied to this upper metal surface and a window is formed in the mask which follows the junction between the emitter and gate layers. The contact material overlying this boundary is then removed as by etching to separate the emitter and gate contacts. Thereafter the entire upper surface is covered with a second photolithographic mask which extends over the gate metallizing and across the exposed silicon surface containing the junction between the emitter and gate layers. A second metal layer, preferably aluminum, which may be thicker than the first layer, is then deposited over the entire upper surface of the device. The second layer is sintered in a suitable sintering operation such that the second metal layer sinters to the first metal layer which covers the upper semiconductor surface. However, that portion of the second metal layer overlying the photoresist pattern will not sinter to the underlying first layer, and the photoresist mask disintegrates during the sintering operation. The portion of the second aluminum layer overlying the photoresist can then be lifted off or washed from the upper surface of the device after the sintering operation is completed.

As a result of the process, the contact on the emitter region will have the thickness of the two metal layers, whereas the contact to the base region will have the thickness of only the first metal layer. Thus, there is formed a structure in which the emitter layer has a substantially higher level than the base layer so that a flat expansion contact can make contact to the emitter contact metal without short-circuiting to the base.

Moreover, the process is extremely repeatable and lends itself to high speed economical mass production techniques.

BRIEF DESCRIPTION OF THE DRAWINGS

FIG. 1 is a top view of a wafer of semiconductor material after base and emitter junctions have been formed therein by appropriate diffusion techniques or the like.

FIG. 4 shows the section of FIG. 3 after the formation thereon of a first aluminum layer followed by the formation of a photoresist layer which has been hardened by suitable processing to define a mask exposing only a region spanning the junction between the interdigitated emitter and base of the device of FIGS. 1 to 4.

FIG. 5 shows the next step in the process of the invention wherein the underlying aluminum layer is etched through the mask defined in FIG. 4 and the mask material is removed.

FIG. 6 shows the next step in the process of the invention, wherein a second photoresist layer is deposited atop the structure of FIG. 5.

DETAILED DESCRIPTION OF THE DRAWINGS

Figure 1:
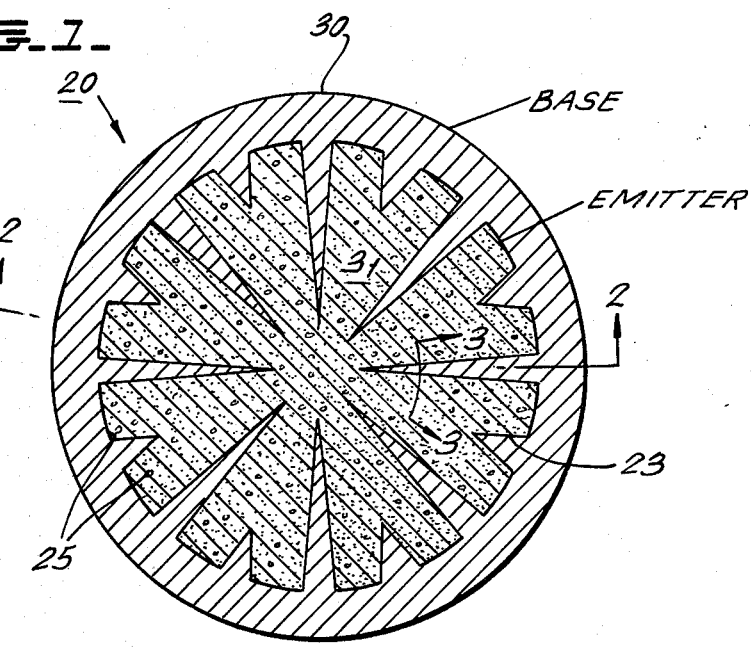
Figure 2:
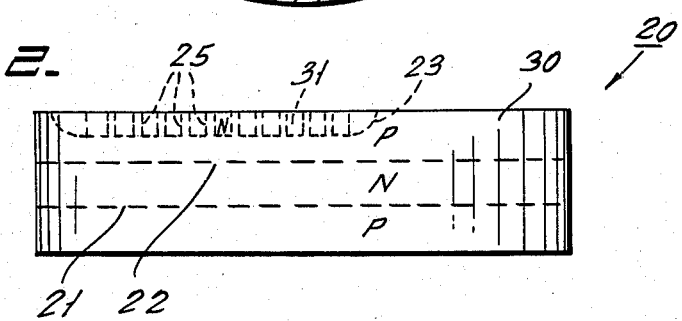
FIG. 2 is a cross-sectional view of the wafer of FIG. 1.

Referring first to FIGS. 1 and 2, there is shown therein a basic wafer containing the junctions needed to make the device a high speed controlled rectifier having interdigitated base and emitter contacts. In FIGS. 1 and 2, the wafer consists of a monocrystalline silicon wafer 20 which could, for example, have a diameter of about one inch and a thickness of about 15 mils.

By appropriate processing, the necessary junctions are formed. These include junctions 21, 22 and an emitter-gate junction 23, which is an extremely long area created by the interdigitation of the gate and emitter regions to ensure turn-on of the device over a large area so that the device can have a high rate of rise of current during turn-on.

A particular pattern has been selected to illustrate the invention in FIG. 1, but it will be apparent to those skilled in the art that any interdigitated pattern could be used in connection with the invention. It should also be understood that the invention can also apply to any device, including power transistors, triacs, and the like which have at least two contacts on one surface which are to be selectively contacted by a pressure contact.

FIG. 1 illustrates a plurality of P-type regions 25 which extend from the layer above junction 22 through the emitter layer above junction 23. These regions 25 are small P-type regions distributed over the emitter to impart shorted emitter characteristics to the device, thereby to control the rate of rise of voltage characteristics of the device, as well known.

The junction 23 in FIG. 1 divides the gate region 30 from the central emitter area 31. It is necessary to make electrical contact to both the layers 30 and 31. The contact to layer 31 in the case of a high current rated device should preferably be a pressure contact through the medium of an expansion plate of molybdenum or the like.

In accordance with the present invention, a novel method is provided for placing the gate and emitter contact metallizing on the upper surface of the device of FIGS. 1 and 2 so that the level of the emitter metallizing is substantially above that of the gate metallizing, thus enabling pressure contact to the emitter metal without contact to the base which would short-circuit the emitter and gate regions.

Figure 3:
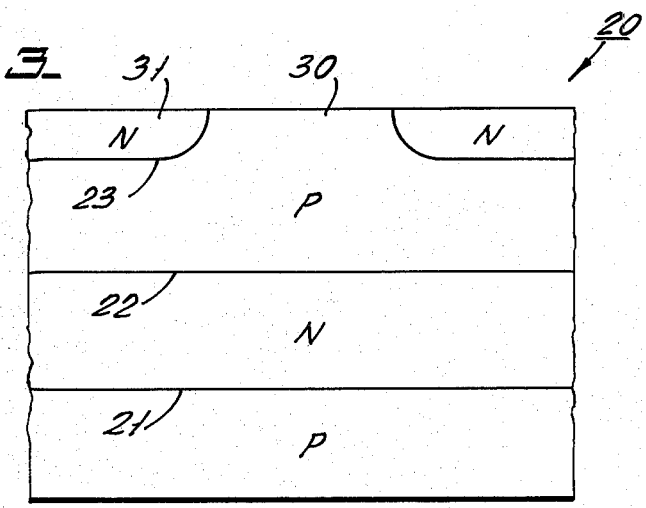
FIG. 3 is a cross-sectional view of the wafer of FIG. 1 taken across the section line 3—3 in FIG. 1.

The process of the invention is described in connection with FIG. 3 which is the section seen across line 3—3 of FIG. 1. It will be understood that the metallizing patterns for the emitter region 31 and base region 30 will extend over the full geometry of their respective areas.

The first step in the process of the invention is the deposition of a first metal layer 40, which may be aluminum, having a thickness of from 0.1 mil to about 0.5 mil. Other thicknesses and other metals could be used. The aluminum layer 40 may be applied to the upper surface of the wafer by sputtering or by evaporation techniques.

Thereafter, a photoresist mask 41 is formed on top of the first aluminum layer 40. Through suitable photoresist processing techniques, an elongated window 42, following the junction 23 at the wafer surface is formed in the photo mask 41 and has a width of about 6 mils. Note that, in FIG. 4, two sections of the window 42 are seen, and, for convenience, are labeled sections 42 and 43.

Thereafter an aluminum etch is carried out through the windows 42 and 43 to etch the underlying aluminum layer 40 from the surface of the device in a region extending across the junction 23 as shown in FIG. 5. This separates the aluminum layer into two insulated layers 55 and 56 on the emitter and gate regions, respectively. The aluminum etch can be carried out by a mixture of dilute nitric acid, phosphoric acid and water or by dilute hydrofluoric acid or the like.

The aluminum layer 40 is then sintered, for example, at a temperature between 500° and 577° C. in order to sinter the aluminum into the gate and emitter regions on the surface of wafer 20, and in order to decompose the photoresist mask 41 of FIG. 4 and remove the mask.

As an alternative method of manufacture and in accordance with the invention, the process can be modified so that the first step of the process is the formation of the photoresist pattern 41 directly on the upper surface of the silicon wafer at regions which are to be free of metallization. The first metal layer 40 of FIG. 4 is then deposited over the photoresist mask and the metal is sintered, causing the underlying photoresist to decompose and the metal atop the decomposed photoresist to lift off. The arrangement of FIG. 5 is then produced without requiring the metal etching step.

Figure 7:
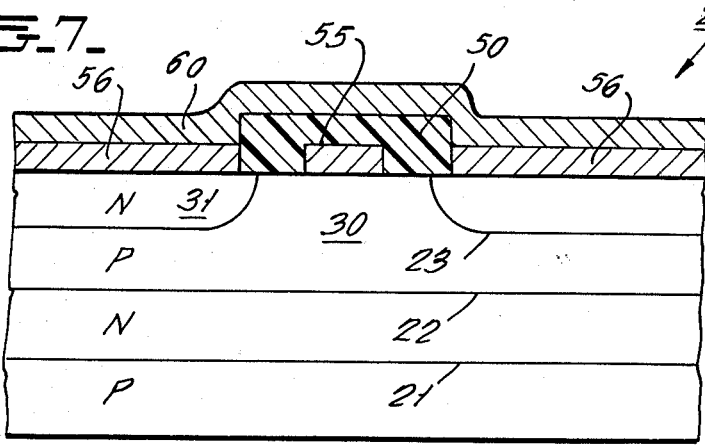
FIG. 7 shows the next step in the process of the invention wherein the photoresist layer of FIG. 6 has been processed to the mask to be washed away over the emitter contact layer, and further shows the subsequent deposition of a second metal layer atop the full exposed surface.

Thereafter and as shown in FIG. 6, a second photoresist mask 50 is deposited over the upper surface of the first aluminum layer sections 55 and 56. Note that the photoresist layer 50 fills in the gap between the aluminum layer sections 55 and 56 which is the exposed silicon band lying atop and spanning the full length of junction 23. Thereafter and using conventional photolithographic techniques, the photolithographic material 50 overlying gate electrode section 55 and the exposed silicon in the gap containing junction 23 is exposed to ultraviolet light through a mask and is hardened, and the mask portion overlying emitter layer section 56 is washed away. Thereafter and as shown in FIG. 7, a second metal layer 60 is deposited over the full surface of the device including the underlying layer 40 and the photoresist 50. The second metal layer 60 can be of any desired metal, preferably aluminum, and may have any desired thickness preferably equal to or greater than the thickness of layer 40. For example, layer 60 may have a thickness of about 1 mil.

The wafer is then placed in a sintering furnace to sinter the layer 60 to underlying layer 56. This sintering temperature can, for example, be from 500° to 577° C. During the sintering operation, the photoresist 50 beneath layer 60 decomposes and the portion of layer 60 which is atop the photoresist 50 will not adhere and lift off. The aluminum of layer 60 overlying layer 56 will, however, remain intact and sinter with layer 56.

Figure 8:
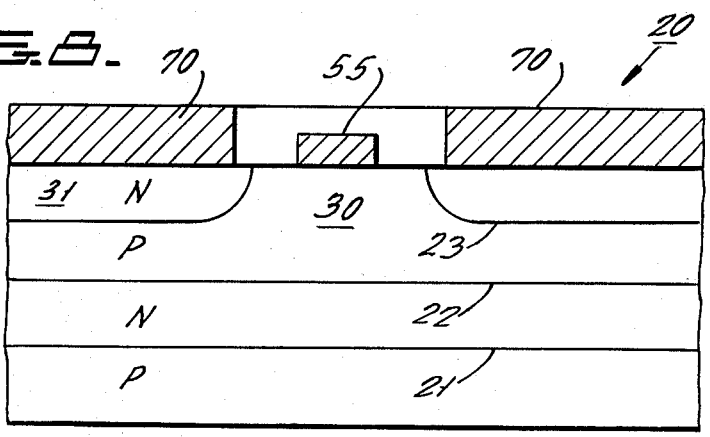
FIG. 8 shows the next step in the process of the invention wherein the second metal layer deposited in the step of FIG. 7 has been sintered and the second metal layer overlying the photoresist has been lifted off and removed.

The resulting device is then suitably washed and etched and will have the appearance shown in FIG. 8, wherein the emitter contact metal 70, which is the sintered combination of the two layers 56 and 60 will have a thickness of about 1.5 mils, whereas the original base contact layer 55 will have its original thickness of about 0.5 mil. Thus the emitter layer 70 lies substantially above the level of the base layer 55. Note that the upper surfaces of layers 70 and 55 will be very flat and will lie in parallel planes. This then enables connection by a flat molybdenum expansion plate to the emitter layer 70 during the assembly of the device.

Following the sintering of the aluminum layer 70, the contact surfaces can be nickel-plated for 15 minutes and then gold-plated for 10 minutes. A wax is then sprayed on the front of the device and the device may be bevel-lapped (not shown). Thereafter a polish etch can be used. The gate is then bonded to an aluminum pad (not shown) and a final etch prepares the device to receive the expansion plates.

Figure 9:
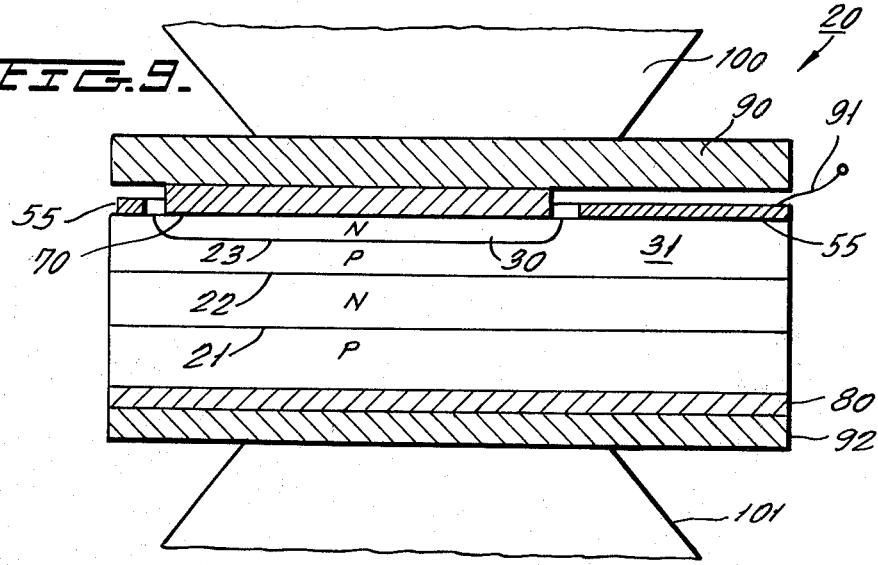
FIG. 9 is a cross-sectional view of the subsequently completed device taken across a section line such as the section line 2—2 in FIG. 1 and shows the device assembled with expansion plates between opposing pressure poles.

The finally completed wafer is shown in cross-section in FIG. 9 through a section similar to section 2—2 in FIG. 1, where the device is shown as having the raised emitter contact 70 and relatively low height base contact 55.

FIG. 9 also shows an anode contact layer 80 applied to the rear surface of the device. FIG. 9 further shows a molybdenum expansion plate 90 which can, for example, have a thickness of 35 mils and perfectly flat opposing surfaces pressed into contact with the emitter layer 70 without fear of accidental contact to the base layer 55. Note that a suitable gate lead 91 is attached to the base layer 55 in FIG. 9.

A second molybdenum expansion plate 92 can be connected to the back side of the wafer, and the device is then suitably mounted between two copper pole pieces 100 and 101 which are pressed against the molybdenum expansion plates 90 and 92, respectively, in order to make good electrical connection to the main electrodes of the wafer 20 in the usual manner.

The present invention may be embodied in other specific forms without departing from the spirit or essential attributes thereof, and, accordingly, reference should be made to the appended claims, rather than to the foregoing specification, as indicating the scope of the invention.

What is claimed is:

1. The process of manufacture of a high power semiconductor device comprising the steps of:
    forming an interdigitated emitter region and gate region which terminate on an elongated junction extending over one surface of a semiconductor wafer;
    forming a first metal layer atop the full area of said one surface;
    removing an elongated region of said first metal layer from a thin elongated region spanning across said junction at said one surface to define separate emitter and gate region contacts;
    forming a photoresist mask over the portion of said one surface exposed by said thin elongated region of metal removed from said first metal layer and over said first metal layer atop said gate region;
    forming a second metal layer atop the full exposed area of said first metal layer and said photoresist mask;
    sintering the overlying second metal layer into said first metal layer to define an emitter contact of thickness equal to the combined thickness of said first and second metal layers; and decomposing said photoresist mask during said sintering step;
    and removing the region of said second metal layer from atop said photoresist mask to define a gate contact having a thickness defined by the thickness of said first layer.

2. The process of claim 1, wherein said first and second metal layers are of the same material.

3. The process of claim 1, wherein said first and second metal layers are each aluminum.

4. The process of claim 1, 2 or 3, wherein said first metal layer has a thickness greater than about 0.1 mil.

5. The process of claim 4, wherein said second metal layer has a thickness of at least twice the thickness of said first metal layer.

6. The process of claim 1, 2 or 3, wherein said elongated region of said first mask is removed through the use of etching through a first photolithographic mask, and wherein said first metal layer is sintered to said silicon wafer after removal of said elongated region of said first metal layer to secure said first metal layer to said wafer and to decompose said first photolithographic mask.

7. The process of claim 6, wherein said first metal layer has a thickness of about 0.5 mil and said second metal layer has a thickness of about 1.0 mil.

* * * * *